United States Patent [19]

Ikegaya et al.

[11] Patent Number: 4,859,490
[45] Date of Patent: Aug. 22, 1989

[54] METHOD FOR SYNTHESIZING DIAMOND

[75] Inventors: Akihiko Ikegaya, Itami; Masaaki Tobioka, Kobe, both of Japan

[73] Assignee: Sumitomo Electric Industries, Ltd., Osaka, Japan

[21] Appl. No.: 75,470

[22] Filed: Jul. 20, 1987

[30] Foreign Application Priority Data

Jul. 23, 1986 [JP] Japan .................. 61-173366
Mar. 27, 1987 [JP] Japan ................... 62-75282

[51] Int. Cl.$^4$ .............................................. B05D 3/06
[52] U.S. Cl. ...................................... 427/38; 427/294; 427/314; 427/318
[58] Field of Search ................... 427/38, 294, 318, 314

[56] References Cited

U.S. PATENT DOCUMENTS 4,434,188  2/1984  Kamo et al. ..................... 427/39

FOREIGN PATENT DOCUMENTS 0161829   4/1988  European Pat. Off. .
0183254  11/1988  European Pat. Off. .
60-70178   4/1985  Japan .
60-122794 11/1985  Japan .

Primary Examiner—Bernard Pianalto
Attorney, Agent, or Firm—Pennie & Edmonds

[57] ABSTRACT

A method and apparatus for synthesizing diamond film or coating by applying low-pressurized vapor phase capable of precipitating diamond on the surface of a substrate by activating gas composed of carbon including solid carbon, hydrocarbon, and carbon tetrachloride respectively being mixed with hydrogen. More particularly, the invention relates to an apparatus and method of synthesizing diamond by disposing a grid between a thermoelectron-radiating material heated with activated material gas to a minimum of 1,600° C., and the substrate to be coated, where the thermoelectron radiating material and grid are respectively used for the negative and positive electrodes, followed by provision of potentials by causing the positive and negative electrodes to respectively be connected to the grid and the substrate by arranging another power supply source. The method of synthesizing diamond according to the invention securely generates extremely fine crystalline diamond particles each having a maximum of 2 μm of diameter and provides extremely consummate diamond film having a minimum of $10^{10} \Omega$·cm of electric resistance, which is substantially the guide for determining the residal amount of carbon such as amorphous carbon and graphite.

6 Claims, 1 Drawing Sheet

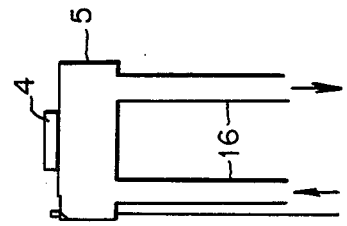

METHOD FOR SYNTHESIZING DIAMOND

TABLE OF CONTENTS

1. Background of the Invention
   1.1 Technical Field
   1.2 Description Of Related Art
2. Summary Of The Invention
3. Description Of The Drawings
4. Description Of The Preferred Embodiments
   4.1 Example 1
   4.2 Example 2
   4.3 Example 3
   4.4 Example 4

1. BACKGROUND OF THE INVENTION

1.1 Technical Field

The present invention relates to an improved vapor phase synthesis of diamond (cubic crystalline carbon). More particularly, the invention relates to a method of synthesizing extremely consummate (perfect) diamond film which is virtually free of impurities, e.g., graphitic and amorphous carbon.

1.2 Description of Related Art

Conventionally, synthetic diamond is produced under conditions of high temperature and high pressure which consequently entail high processing costs. Recently, methods have been developed for synthesizing diamond from gaseous feed (e.g., mixtures of $CH_4$ and $H_2$ under conditions that do not require high pressure). Typical examples of such methods are disclosed in the following references:

(1) Japanese Laid-Open Patent Application No. 58-135117 (1983), Japanese Application No. 61-8458 (1986), and Japanese application No. 61-8459 (1986) describe high radio-frequency plasma chemical vapor deposition ("CVD") methods. U.S. Pat. No. 4,434,188 (corresponding to Japanese Laid-Open Patent Application No. 59-3098 (1984)), and Japanese Laid-Open Patent Application No. 58-100494 (1983) disclose microwave plasma CVD methods.

(2) Some prior arts have proposed ionized vaporization method and ion-beam vaporization method by applying ionized particles.

(3) Japanese Laid-Open Patent Application No. 58-91100 (1983) describes a neutral ion CVD method employing a thermoelectron radiating material.

(4) Published European Patent Application No. 161,829 (corresponding to Japanese Laid-Open Patent Application 60-221395 (1985)) describes a CVD method employing electron bombardment.

Of the foregoing methods, those described in the references cited in items (1) and (3) allow the synthesis of diamond film. The methods in item (2) generate non-crystalline "diamond-like" carbon film. The method described in the references cited in item (4) achieves better results than the other methods by affording a faster diamond film thickness growth rate, i.e., at 3 through 5 μm per hour. Furthermore, this method enhances the density of the diamond nucleus generated during the initial period of diamond film growth. However, this occurs only at high volume ratios of $CH_4$ to $H_2$. When this condition is present, the intensity of the Raman spectrum peak at 1,550 $cm^{-1}$, attributable to amorphous carbon, becomes too high, and a lower quality diamond results.

Because of the insufficient growth rate of diamond films produced according to prior methods, it has not heretofore been possible to produce diamond film material in bulk.

Because crystalline diamond films are extremely rigid, hard and have high thermal conductivity, it has been proposed to employ them as surface-coatings for producing wear-resistant parts such as in cutting tools, and as heat-sink components of semiconductor devices. In addition, due to the presence of considerable band gap, use has been made of chemical doped crystalline diamond films in semiconductor devices.

Microwave plasma CVD methods can be used to produce extremely consummate diamond, i.e., diamond which is almost free of graphitic and amorphous forms of carbon (i.e., having non-diamond structures) as identified by Raman spectroscopy, while featuring extremely high electrical resistance and cubic crystalline structural uniformity. However, due to the short wavelengths of microwaves, when applying any method that generates non-polar microwave discharges within a reaction tube vertically disposed within a conventional waveguide tube, if the reaction tube has diameter greater than the wavelength of microwaves, then the system cannot be entirely free of microwave leakage out of the reaction tube. Accordingly, the diameter of such tube is constrained by the wavelength of the microwaves, thus making it difficult for the reaction tube to provide wide diamond film coating zones with attendant difficulty in implementing mass production. More particularly, for example, Japanese industry normally uses microwave frequencies of 915 MHz and 2,350 MHz for commercial applications. These frequencies limit the diameter of the reaction tube to within a maximum of 120 mm and 50 mm, respectively. Consequently, such tubes are not suitable for obtaining large-dimension, durable diamond film coating zones useful for production on an industrial scale. On the other hand, when applying radio-frequency ("RF") plasma CVD methods, in order to synthesize extremely consummate diamond, the system requires the generation of an extremely intense plasma. Only induction-coupling type RF power supply sources are actually suitable for generating plasma in such cases. It should be noted that capacity-coupling type RF power supply sources cannot be used synthesize crystalline diamond, but rather only amorphous diamond.

In other words, in order to generate a large-dimension coating zone by applying induction-coupling type RF, the system should be provided with an extremely large-capacity RF power-supply source which in turn entails considerable difficulty in industrial applications.

On the other hand, since the method described in the reference cited above in item (4) involves electron-assisted CVD using an electron bombardment, the amount of power that can be supplied between filaments and the substrate is limited. Thus, it cannot achieve the film growth rate made possible by the diamond synthesis method of the present invention. Furthermore, since it is essential for such prior method to employ the assistance of electrons, and since the electron bombardment does not reach the substrate itself under high pressure, this prior method cannot actually generate diamond film by applying the high gas pressures (50 to 500 Torr) according to the present invention.

In principle, due to the diversity of configurations and applicability of a plurality of thermoelectron radiating materials, and in addition, as a result of the proper arrangement of these materials and the substrate, the thermoelectron radiating material CVD method can process a large amount of diamond and also achieve coatings over a large area. However, the prior art thermoelectron method still suffers from a number of drawbacks, for example, in cases where more non-crystalline carbon is present in the synthesized product as compared to product synthesized by the microwave plasma CVD method, thus degrading the structural quality of the diamond coating, while also undesirably decreasing electrical resistance.

2. SUMMARY OF THE INVENTION

In light of the foregoing problems, it has been found that the thermoelectron radiating material CVD method is advantageous for implementing mass production of diamond film of improved quality, according to the present invention.

In addition it has been discovered that microwave plasma can be used to generate excellent quality diamond film by the CVD method, wherein raw material gas is decomposed and becomes activated to produce radicals and ions in a variety of concentrations and types which are suitably reactive. According to these concepts, it has been discovered that these conditions are advantageous for synthesizing extremely consummate diamond film, and useful applications of plasma have been found which securely promote the activation degree of raw material gas based on the thermoelectron radiating material CVD method.

More particularly, the invention provides a method of synthesizing diamond under low-pressure vapor phase reaction conditions wherein diamond is precipitated on the surface of a substrate heated to between about 600° C. and about 1,200° C. by activating raw material feed gas composed of a mixture of hydrogen with solid carbon, or hydrocarbon, or hydrocarbon containing O and N in bonded radicals, or carbon tetrachloride. The method comprises the sequential steps of activating the above raw material gas by applying thermoelectron radiating material heated to a temperature of at least about 1,600° C.; providing an electrical potential by connecting a positive electrode to a grid disposed between the thermoelectron radiating material (which is provided with a negative electrode) and the substrate to be coated by applying a DC power supply source; extracting thermoelectrons for generating plasma; providing an electrical potential by connecting the positive and negative electrodes, respectively, to the grid and the substrate from another DC power supply source; generating plasma by maintaining the substrate at a negative potential so that the effect of the activation generated by the thermoelectron radiating material and the generated DC plasma are jointly applied; and maintaining the pressure inside of the reactor generating the DC plasma to between a minimum of about 10 Torr and a maximum of about 400 Torr.

By applying a negative electrical potential to the substrate, it has been found that the system can simultaneously generate DC bias effect which is conventionally available for ion-plating processes. In order to assure the formation of extremely consummate diamond, pressurized gas ranging from 10 Torr to several hundred Torr are needed to generate the required plasma. It should be noted that term "extremely consummate diamond film" denotes a film of diamond particles having a maximum mean particle size of 2 microns which film is mainly composed of surface (110) having a minimum of $10^{10} \Omega$·cm of electric resistance. Although the diamond film may also be provided with surfaces (100) or (110) as well, due to convenience of tools, the diamond surface should desirably be provided with surface (111). It should also be noted that electrical resistance normally indicates a certain amount of residual carbon such as amorphous carbon and graphite In other words, the higher the electric resistance, the less is the amount of residual carbon.

3. BRIEF DESCRIPTION OF THE DRAWINGS

The invention will be better understood from the following detailed description and the accompanying drawings which are given by way of illustration only, and thus are not limitative of the invention and wherein:

FIG. 1 is a front-elevational cross-sectional view in partial block diagram form of a preferred embodiment of an apparatus for synthesizing diamond film according to the invention, wherein the components of the apparatus are denoted by the following reference numerals 1. Raw material gas inlet;
2. W-filament of thermoelectron radiating material;
3. Grid;
4. Substrate;
5. Substrate holding base;
6. AC power supply for heating the thermoelectron radiating material;
7. DC power supply for generating plasma between the thermoelectron radiating material and the grid;
8. DC power supply for providing the substrate with a negative potential;
9. Vacuum exhaust outlet;
10. Insulation seals
11. External furnace;
12. Transparent quartz reaction tube;
13. Negative electrode attached to thermoelectron radiating material;
14. Positive electrode attached to grid; and
15. Negative electrode attached to substrate.

FIG. 2 is a front-elevational cross-sectional schemative view of the substrate and substrate holding base shown in FIG. 1 according to a preferred embodiment of the invention, wherein the base is provided with cooling means 16. The cooling device or means regulates and maintains proper temperature of the substrate by allowing a fluid coolant, e.g, water and/or gas to flow through it. The arrows denote the direction of flow of the coolant. It is also possible for the substrate holding base to control the temperature more precisely by providing temperature measuring means (not shown) in part of the substrate or the substrate holding base. In the following description, the same structural elements shown in the accompanying drawings are designated by the same reference numerals.

4. DESCRIPTION OF THE PREFERRED EMBODIMENTS

FIG. 1 is a simplified block diagram of a preferred embodiment of the apparatus for synthesizing diamond according to the invention. In operating the apparatus, gaseous $CH_4$ and $H_2$ are fed into quartz reaction tube 12 via raw-material gas inlet 1. The mixed gases are thermally activated by thermoelectron radiating material 2 heated to more than 1,600° C. Negative electrode 13 and positive electrode 14 are connected to thermoelectron radiating material 2 and grid 3, respectively, from DC power supply 7 so that plasma can be generated in the region between the thermoelectron radiating material and the grid. The substrate 4 is provided with a negative potential by connecting a negative electrode 15 to the substrate 4 through holding base 5 so that positive ions will be drawn onto the surface of the substrate. Reaction tube 12 contains extremely high pressurized gas ranging from a minumum of 10 Torr to a maximum of 400 Torr. An AC power supply 6 is provided for heating the thermoelectron radiating material 2. The apparatus is also provided with vacuum exhaust outlet 9, insulating seals 10, and external furnace 11, respectively.

The invention provides four features which are summarized below.

1. By applying DC plasma concurrently with pyrolysis and activation of raw material gas generated by an extremely heated thermoelectron radiating material 2, the degree of activation of raw material gas is enhanced and causes the generation of ions of a type which otherwise cannot be produced merely by means of pyrolysis.

2. Negative potential is applied to the substrate 4 to draw positive ions onto the substrate surface.

3. By disposing grid 3 between the thermoelectron radiating material 2 and the substrate 4, the apparatus generates plasma between the thermoelectron radiating material and the grid and also between the grid and the substrate.

4. The apparatus of the invention generates plasma by applying extremely high pressure ranging from a minimum of 10 Torr to a maximum of 400 Torr. Normally, plasma cannot be generated stably or maintained merely by applying a DC power-supply source under the high pressures mentioned above.

In order to generate and maintain a plasma by applying a high pressure ranging from a minimum of 10 Torr to a maximum of 400 Torr, it is essential for the system to extract thermoelectrons from a thermoelectron radiating material 2. When feeding negative potential to the substrate 4, if the negative electrode and the positive electrode were respectively connected to the substrate 4, and thermoelectron radiating material 2 by applying DC power-supply sources, thermoelectrons could not be extracted from the thermoelectron radiating material; rather, thermoelectrons would be driven back, and as a result, no plasma could be generated under the high pressure conditions mentioned above.

The apparatus of the invention features a grid 3 disposed between a thermoelectron radiating material 2 and the substrate 4 so that plasma can be generated between these members by allowing thermoelectrons to be extracted from the thermoelectron radiating material after connecting the negative electrode to the thermoelectron radiating material and the positive electrode to the grid by applying DC power-supply source 7. Furthermore, the apparatus causes the positive ions so generated to be drawn onto the substrate 4 and generates plasma by connecting the positive electrode and the negative electrode to the grid and to the substrate, respectively, by applying another DC power supply source 8.

Without wishing to be bound by theory, it is believed that the the diamond synthesis method and apparatus of the invention are able to generate an extremely consummate diamond film for the reasons explained below.

The invention allows generation of DC plasma in addition to the pyrolysis and the activation of raw material gas by thermoelectron radiating material wherein the degree of activation can securely be promoted. This in turn intensifies the energy of the activated gas and increases the proportion of gas remaining in the activated state, which activated gas includes hydrogen radicals capable of selectively preventing carbon (other than diamond) from coprecipitating with diamond, and/or methyl radicals having SP3 molecular orbitals needed for generating diamond. In addition, the extended life of the activated gas prevents the precipitation of graphite and/or amorphous carbon, thus facilitating the production of extremely consummate diamond film.

Furthermore, it has been discovered that the strength of the bond between the diamond film and the substrate is promoted significantly by applying a negative potential to the substrate from a DC power supply. Although the reason for this effect is not clear, it is believed that the positive ions in the raw material gas ionized by plasma generated between the thermoelectron radiating material and the grid are drawn preferentially onto the surface of the substrate.

Furthermore, the diamond synthesis method of the invention has been found to be capable of generating a significantly fine composition of the diamond film on the surface of the substrate. It is probable that both the impact of the ions against the surface of the substrate and the plasma generated on the surface of the substrate advantageously affect the degree of activation of the activated ingredients, concentration, and the life of these activated ingredients as well, thus effectively increasing the density of the diamond nucleus being generated.

The process of the invention is advantageously conducted under high pressure which increases the density of the generated diamond necleus.

The invention consistently provides an extremely consummate diamond film which is free from graphitic and non-crystalline carbon and is composed of diamond nuclei or particles having a maximum diameter of 1 micron even after being exposed to a minimum of 1,000° C. of high temperature whereby an extremely high strength bond between the diamond film and the substrate is achieved.

The method of synthesizing diamond according to the invention allows the use of carbon-containing ingredients, for example, solid carbon, or hydrocarbon, or hydrocarbon containing O and N in bonded radicals, or carbon tetrachloride. It is possible for the diamond synthesis method of the invention to use effectively raw material gas composed of a mixture of two or more of these carbon-containing ingredients and hydrogen. When solid carbon constitutes the source, it is desirable to use a thermoelectron radiating material made of carbon.

With regard to the raw material gases present in the reactor, a specific relation between the number of carbon atoms and the number of hydrogen atoms should be maintained, i.e., between a minimum of 0.01% and a maximum of 20% of the atoms should be carbon. If the percentage of carbon atoms in the raw material gas is less than 0.01%, diamond film will grow at an extremely slow rate, and which is not durable enough for industrial use. Conversely, if the percentage of carbon atoms in the raw material gas exceeds 20%, a greater amount of non-crystalline carbon will be precipitated, and eventually inhibit the formation of diamond film.

In addition to the foregoing gas ingredients, Ar, Kr, Xe, Rn, and Ne, which do not participate chemically in the reaction, may also be used in admixture with the gas ingredients mentioned above. These inert gaseous components can be used effectively for cooling the substrate (which has low thermal conductivity), while advantageously serving to adjust the strength of the plasma.

It is essential that the thermoelectron radiating material and the grid material have low vapor pressures at the high temperatures involved in the process and have high melting points as well.

Moreover, it is essential that the thermoelectron radiating material be capable of releasing thermoelectrons under the process conditions. Consequently, it is desirable that both the thermoelectron radiating material and the grid be made from those materials having high melting points. Such materials include tungsten (W), tantalum (Ta), or molybdenum (Mo), $LaB_6$, graphite, and the like. Thermoelectron radiating materials should be used only after being heated to at least 1,600° C. If the temperature drops below 1,600° C., graphite and amorphous carbon will predominante in the precipitate. Unless the surface of the substrate is at a temperature of between 600° C. and 1,200° C., diamond does not precipitate at all.

The reactor should be provided with an internal pressure of between a minimum of 10 Torr and a maximum of 400 Torr, preferably between a minimum of 50 Torr and a maximum of 300 Torr. If the pressure within the reactor exceeds 400 Torr, it becomes difficult to maintain plasma stably between the grid and the substrate. Conversely, if the pressure within the reactor is less than 10 Torr, vaporization speed will decrease significantly, which is undesirable.

The invention features the capability of stably generating and maintaining plasma under high pressure, which cannot actually be realized by any conventional system that merely uses a DC power supply source. This is because the increase in gas pressure effectively enhances the density of the generated diamond nucleus.

The intensity of the plasma generated between the thermoelectron radiating material and the grid depends on the composition of the gas feed, the configuration and relative arrangement of the thermoelectron radiating material and the grid, the temperature of thermoelectron radiating material, and the power output from the DC power supply. Since the plasma occurs in the region near the grid, it is desirable for the apparatus to control properly the plasma-generating condition by controlling the DC power supply source which is connected to the grid.

In practicing the invention, it is desirable for the apparatus to feed a minimum of 10 W/cm$^2$ of DC power between the thermoelectron radiating material and the grid. If the apparatus receives less than 10 W/cm$^2$ of DC power, the apparatus cannot stably generate and maintain plasma between the grid and the substrate. Furthermore, the intensity of the plasma generated between the grid and the substrate depends on the intensity of the plasma generated between the thermoelectron radiating material and the grid, the gas atmosphere, configuration and arrangment of the grid, substrate and substrate holding base, and the power output from the DC power supply. As in the above case, since plasma is generated in the vicinity of the grid and the surface of the substrate facing the grid, it is desirable for the apparatus to control properly the plasma by applying DC power supply source delivered per unit area of the substrate to be coated.

The apparatus of the invention should desirably feed a minimum of 5 W/cm$^2$ and a maximum of 200 W/cm$^2$ of DC power between the thermoelectron radiating material and the grid. If less than 5 W/cm$^2$ of DC power is delivered, the apparatus will not be able to stably generate and maintain plasma between the grid and the substrate. Conversely, if more than 200 W/cm$^2$ of DC power is delivered, the plasma etching effect will be magnified, with attendant undsirable decrease in the diamond precipitation rate.

The temperature at the surface of the substrate depends on the temperature of the thermoelectron radiating material, the arrangement and configuration of the thermoelectron radiating material, grid, and substrate, the DC power being delivered between the thermoelectron radiating material and the grid, the DC power being delivered between the grid and the substrate, the composition of the gas atmosphere, and the temperature of the external furnace. The optimum results of the invention are realized by appropriate selection of specific conditions from among those mentioned above.

It may be necessary for the diamond synthesizing apparatus of the invention to contain means for cooling the substrate holding base and the wall of the reactor in order to achieve precise control of the temperatue at the surface of the substrate within an adequate range. Control of the surface temperature of the substrate is extremely important for the apparatus of the invention in order to control correctly the stress within the diamond film.

More particularly, there is a difference in the coefficients of thermal expansion of the diamond and the substrate, and thus, since there is a difference between the diamond synthesizing temperature and the temperature actually being used, stress remains in the diamond film. If the remaining stress is too great, the diamond film will be stripped off from the substrate. The greater the thickness of the diamond film, the greater is the possibility for the diamond film to be stripped off the substrate. However, for reasons which are not entirely clear, a more satisfactory diamond film is generated when more than a specific amount of stress remains therein.

Referring more particularly to the accompanying drawings, preferred embodiments of the method and apparatus for synthesizing diamond according the invention are described in the following non-limiting examples:

4.1 Example 1

Using a substrate made from molybdenum (Mo) plate, having dimensions of 10 mm × 10 mm × 1 mm and a surface which is ground with #5000 diamond grinding particles, in the diamond synthesizing apparatus shown in FIG. 1, the following diamond coating operations are carried out.

First, the reactor is evacuated to a maximum pressure of 10$^{-3}$ Torr. Then, a gaseous mixture of $CH_4$ and $H_2$ is fed into the reactor at the rate of 100 ml/min. While maintaining a specific pressure inside of the reactor and using a tungsten (W)-made filament which substantially constitutes the thermoelectron radiating material, the compound gas is heated to more than 2,000° C. to adjust the temperature on the surface of the substrate to 920° C. The distance between the tungsten filament and the tungsten grid is set at 5 mm and the distance between the tungsten grid and the molybdenum substrate is set at 4 mm. Next, using a DC power supply source, the filament is connected to the negative electrode and the grid to the positive electrode. Then, using another DC power supply source, the substrate is connected to the negative electrode and the grid to the positive electrode, and the power output in adjusted from these two DC power supply sources flowing through the filaments in order that the temperature on the surface of the substrate is stabilized at 920° C. The diamond synthesis time is set at 4 hours. Table 1 represents the coating conditions and characteristics of the coated film. Depending on the coating conditions, the temperature on the surface of the substrate is adjusted by cooling the substrate holding base.

For comparative evaluation, using the same molybdenum-made substrate and the 2.45 GHz microwave plasma CVD apparatus, feed gas composed of a mixture of $CH_4$ and $H_2$ at a 1/100 volume ratio is introduced into the reactor at the rate of 200 ml/min. As shown in Table 1, using 40 Torr of pressure, 250 W of microwave power, and 910° C. of temperature on the surface of the substrate, a coating process was carried out for 4 hours consecutively. Table 1 also shows the characteristics of the coated film obtained from the comparative evaluation. In order to generate ohmic contact for determining electric resistance of the diamond film, using ion-plating apparatus, an electrode is prepared by coating titanium (Ti) and gold (Au) for making up the first and second layers on the diamond film. Using this electrode and another electrode made from molybdenum substrate plate, the V-I characteristics between these electrodes are measured to determine electrical resistance.

resistance than that of the diamond film generated by Run No. 15 (microwave plasma CVD method).

According Raman spectrum analysis, the presence of amorphous carbon is observed in the diamond film generated by Run No. 14. Conversely, no amorphous carbon is present in those diamond films generated from experiments which applied plasma. Comparative evaluations of Run Nos. 3, 4, 7, and 11 confirm that particles in the diamond film become finer relative to the intensified degree of plasma. Likewise, crystalline particles of diamond become finer when plasma strength is intensified. It is extremely difficult for the microwave plasma CVD method to generate the fine particle film composition like the one mentioned above under conditions of high temperature.

4.2 Example 2

Another preferred embodiment of the method and apparatus for synthesizing diamond according to the invention is described below wherein extremely consummate diamond surpassing that achievable by the microwave plasma CVD method and featuring a maximum particle size of 1 micron and unsurpassed strength of bonding with the substrate is securely generated even under exposure to a minimum of 1,000° C. of high temperature. In addition, in this preferred embodiment of the invention it is possible to execute processing of a plurality of substrates and coating process over a wide area by applying a plurality of thermoelectron radiating materials.

TABLE 1

| Run No. | Pressure (Torr) | Power supplied between filament and grid (W) | Power supplied between grid and substrate (W) | Electric resistance ($\Omega \cdot cm$) | Crystalline particle size ($\mu m$) | Remarks |
|---|---|---|---|---|---|---|
| 1 | 5 | 40 | 40 | — | — | Film was not generated completely. |
| 2 | 10 | 5 | — | — | — | No plasma was generated between the grid and the substrate. |
| 3 | " | 40 | 40 | $10^{11}$–$10^{12}$ | 1–2 | |
| 4 | 50 | " | " | $10^{12}$–$10^{13}$ | 0.7–0.5 | |
| 5 | 100 | 10 | 60 | $10^{11}$–$10^{12}$ | 0.7–1.0 | |
| 6 | " | 40 | 20 | $10^{12}$–$10^{13}$ | 0.4–0.7 | |
| 7 | " | " | 40 | " | 0.1–0.3 | |
| 8 | " | 80 | 20 | " | 0.3–0.5 | |
| 9 | " | " | 40 | " | 0.1–0.3 | |
| 10 | " | " | 60 | " | 0.05–0.2 | |
| 11 | 200 | 40 | 40 | " | " | |
| 12 | 300 | 120 | " | " | " | |
| 13 | 450 | 200 | — | — | — | Plasma did not stabilize itself between the filament and the grid. |
| 14 | 100 | 0 | 0 | $10^4$–$10^5$ | 3–5 | |
| 15 | 40 | Microwave power | — | $10^9$–$10^{10}$ | 1.5–2.5 | |

The results reported in Table 1 show that satisfactory diamond film is uniformly generated except for Run Nos. 1, 2 and 13 which are outside the scope of the invention Compared to Run No. 14 which is conducted without plasma, other runs significantly promoted electric resistance of the diamond film. Table 1 also shows that the runs corresponding to the first preferred embodiment of the invention satisfactorily generated superb diamond film featuring significantly higher electric A molybdenum substrate, having dimensions of 200 mm $\times$ 150 mm $\times$ 10 mm and ground with a #600 diamond whetstone, is coated by applying 21 units of thermoelectron radiating material of the type used in the previous example. In order to adjust the temperature of each thermoelectron radiating material precisely, independently heating power sources are provided so that the temperature of each thermoelectron radiating material can be controlled separately. However, in order to connect the DC power supply source, one side of each of the electrodes is commonly connected. According to the dimension of the substrate, the size of the grid disposed between the thermoelectron radiating material and the substrate is 220 mm×180 mm.

First, the pressure in the reactor is decreased to a maximum of $10^{-3}$ Torr. Then, feed gas which composed of a mixture of $CH_4$ and $H_2$ at a 1/100 volume ratio is introduced into the reactor at a rate of 200 ml/min so that the pressure inside the reactor is held at 90 Torr. The tungsten filament thermoelectron radiating material is heated to a minimum of 2,000° C. whereby the surface of the substrate temperature is adjusted in a within range from 980° C. to 1,010° C.

Next, using a DC power supply source, 40 W of power per unit area of grid are applied by connecting the tungsten filament and the grid to the negative and positive electrodes before eventually generating plasma between the filament and the grid. Next, using another DC power supply source, 20 W of power per unit area of the grid are fed by connecting the grid and the substrate to the positive and negative electrodes before eventually allowing plasma to be generated on the surface of the substrate. Since the supplied DC power tends to heat the surface of the substrate, the amount of DC current flowing through the filament is decreased so that the temperature of the filament can be lowered. The substrate holding base is cooled with water so that the temperature on the surface of the substrate is adjusted to within a range of from 980° C. to 1,010° C.

As a result of the coating process carried out continuously for 4 hours, a diamond film having an average thickness of 8 μm with a maximum unevenness of 10% is successfully produced. Each crystalline particle has an extremely fine size ranging from 0.3 micron to a maximum of 0.8 micron. Evaluation of electrical resistance resulted in quite satisfactory values ranging from $10^{11}$ to a maximum of $10^{12}$ .cm.

The foregoing example confirms that the present invention is capable of extensively and uniformly coating a substrate with extremely consummate diamond film consisting of extremely fine particles.

4.3 Example 3

In this example the substrate used is made from SPG 422 type ISO K-10 cemented carbide. Using the same apparatus as employed in Example, 1, the substrate is coated with diamond film by arranging the distance between the filament and the grid to be 5 mm and the distance between the grid and the upper surface of the insert to be 4 mm.

The pressure within the reactor is decreased to a maximum of $10^{-3}$ Torr. Then, gas composed of a mixture of $CH_4$ and $H_2$ at a 1/100 volume ratio is fed into the reactor at a flow rate 100 ml/min. While maintaining the pressure inside of the reactor at 90 Torr, the tungsten filament is heated to a maximum of 2,000° C. in order that the temperature on the surface of the substrate be 950° C.

Next, using a DC power supply source, the filament and the grid are connected respectively to the negative and positive electrodes for generating potential generating plasma. In addition, using another DC power supply source, the grid and the substrate are connected to the positive and negative electrodes for generating potential. Then, the amount of DC current flowing through the filament and the amount of current output of these two DC power supply sources are adjusted so that the temperature on the surface of the substrate can be held exactly at 950° C. The coating operation is carried out for 3 hours consecutively based on the conditions shown in Table 2.

TABLE 2

| Run No. | Pressure (Torr) | Power supplied between filament and grid (W) | Power supplied between grid and substrate (W) |
|---|---|---|---|
| 16 | 90 | 30 | 30 |
| 17 | " | " | 60 |
| 18 | " | " | 90 |
| 19 | " | 60 | 30 |
| 20 | " | " | 60 |
| 21 | " | " | 90 |

After completing the coating processes under the conditions shown in Table 2, satisfactory diamond film is uniformly generated. For comparison with those inserts used for the experiments, the temperature at the surface of the substrate set is at 950° C. by adjusting the amount of DC current flowing through the filament. In this way, one substrate, A, was subjected to the coating process for 3 hours and another substrate, B, was not treated with the coating process. Using these inserts, cutting tests were carried out based on the conditions shown below.

Objective material: Aluminum-25% silicon
Cutting speed: 500 meters per minute
Material feed rate: 0.1 mm/rev.
Cutting depth: 0.5 mm
Holder: FR 11R - 44A As a result of the above test, substrate B, which was not treated with the coating process, generated 0.40 mm of Frank wear after the cutting process which lasted for 15 seconds, whereas substrate A which was subjected to the coating process generated 0.16 mm of Frank wear after the cutting process which lasted for 20 minutes. Compared to these, after the cutting process which lasted for 30 minutes, those specimens made available for implementing the third preferred embodiment of the invention respectively generated less amount of Frank wear as shown below:

| | | | |
|---|---|---|---|
| Specimen No. 16 | 0.12 mm; | Specimen No. 17 | 0.10 mm |
| Specimen No. 18 | 0.07 mm; | Specimen No. 19 | 0.10 mm |
| Specimen No. 20 | 0.07 mm; | Specimen No. 21 | 0.06 mm |

These foregoing results demonstrate the significant advantageous features of the invention.

4.4 Example 4

By additionally installing the cooling device shown in FIG. 2 onto the apparatus shown in FIG. 1 and by applying the conditions shown below in Table 3 and the procedure set forth in Example 1, diamond film-coating operations are carried out for two hours. These runs successfully generate extremely consummate diamond film having the thicknesses shown in Table 3.

Next, by applying the same conditions and by adjusting the coating time, cutting tools having the configuration No. SPG-422 are processed whereby the thickness of the diamond film becomes exactly 2 μm. The cutting tools so processed are evalutaed by cutting tests. Conditions employed for these cutting tests are shown below:

Objective material: Aluminum - 8% silicon

Cutting speed: 1,800 meters per minute
Material feed rate: 0.1 mm/rev.
Cutting depth: 0.2 mm
Duration of cutting tests: 2 hours Note that the symbols ⊚, ○, Δ, and x shown in Table 3 respectively denote the grade order of worn-out amount between cutting tools which were coated with diamond film according to the invention and those which were not so coated. The least amount of wear is denoted by the double circle, followed by the single circle, the triangle, and x, respectively. Symbol x denotes the amount of wear equivalent to that for an uncoated diamond film.

Runs Nos. 22 through 26 exemplify preferred embodiments of the inventon. Run No. 27 merely generates amorphous carbon and is included for comparison purposes.

When executing the cutting tests in accordance with the conditions shown in Table 3, the temperatures of the substrates are adjusted by applying the cooling device shown in FIG. 2.

significantly greater than that normally generated by the microwave plasma CVD method, the diamond synthesized by the present method and apparatus is useful in a wide variety of electrical materials requiring extremely high insulation effect such as heat-radiating printed wiring boards and diamond semiconductors.

Furthermore, since the method and the apparatus of the invention provide fine-particle-size diamond film even under high temperature above 1000° C. with extremely strong bonding to the substrate, significant improvements in productivity are achieved in those application which can effectively utilize the mechanical characteristics of diamond such as cutting tools and wear-resistant parts.

We claim:

1. A low pressure vapor phase method of synthesizing diamond from a carbon source ingredient selected from solid carbon, hydrocarbon, hydrocarbon additionally containing O and N in bonded radicals, and carbon tetrachloride, where said method causes raw material gas compound of a mixture of said carbon ingredient

TABLE 3

| Run No. | Carbon source | Other gas | Carbon source/ other gas | Thermoelectron radiating material | | Substrate Temperature (°C.) | Substrate material | Pressure (Torr) |
|---|---|---|---|---|---|---|---|---|
| | | | | Material | Temp. (°C.) | | | |
| 22 | CH4 | H2 | 0.5/100 | W | 2000 | 800 | WC—5% Co | 50 |
| 23 | CH3COCH3 | H2 | 1/100 | Ta | 2050 | 950 | Si3N4 | 150 |
| 24 | (CH3)2 CN | H2 | 2/100 | W | 2150 | 900 | WC—5% Co | 80 |
| 25 | Solid C | H2 | — | C | 2300 | 1050 | W | 100 |
| 26 | CH4 | 85H2—15AY | 2/100 | W | 2150 | 900 | WC—5% Co | 150 |
| 27 | CH4 | H2 | 0.5/100 | W | 2000 | 550 | WC—5% Co | 50 |

| Run No. | Film thickness (μm) | Power between filament and grid (W) | Power between grid and substrate (W) | Results of cutting test |
|---|---|---|---|---|
| 22 | 0.8 | 40 | 30 | Δ |
| 23 | 25 | 60 | 40 | ⊚ |
| 24 | 20 | 50 | 50 | ⊚ |
| 25 | 4 | 40 | 40 | ○ |
| 26 | 3 | 25 | 20 | ○ |
| 27 | — | 60 | 30 | X |

As shown in the foregoing description, based on the thermoelectron radiating material CVD method, the present invention activates raw material gas by means of a thermoelectron radiating material heated to a minimum of 1,600° C., and, using a DC power supply, generating potential for the diamond synthesizing apparatus by connecting the thermoelectron radiating material to the negative electrode and the grid to the positive electrode, said grid being disposed between the thermoelectron radiating material and the substrate to be coated with diamond film. In this way, thermoelectrons are extracted from the thermoelectron radiating material whereby plasma is generated. The apparatus of the invention also uses another DC power supply source for generating potential by connecting the grid and the substrate to the positive and negative electrodes for generating plasma while holding the substrate potential negative. The apparatus jointly uses activation generated by thermoelectron radiating material and the other activation caused by generation of DC plasma, and yet, by properly controlling pressure inside of the reactor to a minimum of 10 Torr and a maximum of 400 Torr for causing plasma to be generated, the apparatus securely generates extremely consummate diamond film of significantly better quality than that normally generated by the thermoelectron radiating material CVD method. Furthermore, since the apparatus of the invention provides diamond having an electrical resistance which is and hydrogen to be activated for eventually precipitating diamond on the surface of a substrate heated to a minimum of 600° C. through a maximum of 1,200° C., said method comprising;

(a) causing thermoelectron radiating material heated to a minimum of 1,600° C., to activate said raw material gas;

(b) generating an electrical potential by connecting said thermoelectron radiating material to a negative electrode and connecting a grid disposed between said thermoelectron radiating material and the substrate to be coated to a positive electrode and applying a DC power supply source to said negative and positive electrodes;

(c) extracting thermoelectrons from said thermoelectron radiating material by the electrical potential generated in step (b) to generate a plasma of positive ions between the thermoelectron radiating material and the grid;

(d) generating an electrical potential between the grid and the substrate by connecting the substrate to a negative electrode and applying a second DC power supply source for generating plasma between the grid and the substrate while maintaining the potential of said substrate negative relative to the grid to thereby draw positive plasma ions onto the surface of the substrate to form a coating on said surface of the substrate which is heated to a minimum of 600° C. through a maximum of 1,200° C.;

(e) jointly applying the effect of activation generated by the thermoelectron radiating material and another activation caused by generation of DC plasma; and (f) maintaining the pressure inside the plasma-generating reactor to between 10 Torr and 400 Torr.

2. The method according to claim 1, wherein the proportion of the number of carbon atoms to the number of hydrogen atoms in the raw-material compound gas in said reactor is between about 0.1% and about 20%.

3. The method according to claim 1, wherein said thermoelectron radiating material is substantially comprised of any of the elements including tungsten (W), tantalum (Ta), molybdenum (Mo), LaB6, or graphite.

4. The method according to claim 1, wherein a minimum of 10 W/cm$^2$ of DC power is supplied between said thermoelectron radiating material and grid.

5. The method according to claim 1, wherein 5 through 200 W/cm$^2$ of DC power is supplied between said grid and substrate.

6. The method according to claim 1, wherein temperature on the surface of said substrate is between about 700° C. and 1000° C.

* * * * *